(12) United States Patent
Kajita

(10) Patent No.: US 10,243,540 B2
(45) Date of Patent: Mar. 26, 2019

(54) DIGITAL FILTER

(71) Applicant: Azbil Corporation, Chiyoda-ku (JP)

(72) Inventor: Tetsuya Kajita, Chiyoda-ku (JP)

(73) Assignee: AZBIL CORPORATION, Chiyoda-ku (JP)

( * ) Notice: Subject to any disclaimer, the term of this patent is extended or adjusted under 35 U.S.C. 154(b) by 17 days.

(21) Appl. No.: 15/500,947

(22) PCT Filed: Jul. 15, 2015

(86) PCT No.: PCT/JP2015/070238
§ 371 (c)(1),
(2) Date: Feb. 1, 2017

(87) PCT Pub. No.: WO2016/021382
PCT Pub. Date: Feb. 11, 2016

(65) Prior Publication Data
US 2017/0222627 A1    Aug. 3, 2017

(30) Foreign Application Priority Data
Aug. 4, 2014  (JP) .................................. 2014-158463

(51) Int. Cl.
*H03M 3/00* (2006.01)
*H04J 3/02* (2006.01)
(Continued)

(52) U.S. Cl.
CPC ............ *H03H 17/04* (2013.01); *H03H 17/02* (2013.01); *H03H 17/0282* (2013.01);
(Continued)

(58) Field of Classification Search
CPC ........................ H03H 17/0292; H03H 17/0664
(Continued)

(56) References Cited

U.S. PATENT DOCUMENTS 4,872,129 A   10/1989  Pfeifer et al.
5,157,622 A * 10/1992  Makino .............. H03H 17/0225
                                              708/313
(Continued)

FOREIGN PATENT DOCUMENTS

JP   62-281507 A   12/1987
JP    6-209266 A    7/1994

OTHER PUBLICATIONS

Combined Chinese Office Action and Search Report dated Aug. 3, 2018 in Chinese Patent Application No. 201580041167.5 (with English translation of Category of Cited Documents), 7 pages.
(Continued)

*Primary Examiner* — Matthew S Sandifer
*Assistant Examiner* — Emily E Larocque
(74) *Attorney, Agent, or Firm* — Oblon, McClelland, Maier & Neustadt, L.L.P.

(57) ABSTRACT

A digital filter includes: integration calculation units (10) that are cascade-connected, are fed time-division-multiplexed data, the time-division-multiplexed data being formed of pieces of data on M channels that are time-division multiplexed, the pieces of data on the respective channels being updated at a rate equal to a sampling frequency $f_s$, operate in accordance with a clock having a frequency $f_s \times M$, and integrate the time-division-multiplexed data for every M samples; a frequency conversion unit (11) that operates in accordance with a clock having a frequency $f_D \times M$, decimates data at the sampling frequency $f_s$ input from the integration calculation unit (10) in the last stage at a sampling frequency $f_D$, and delays data obtained as a result of decimation by (M−1) samples; and difference calculation units (12) that operate in accordance with the clock having the frequency $f_D \times M$, are cascade-connected to the output of
(Continued)

the frequency conversion unit (11), and each subtract, from data input thereto, data M samples before.

4 Claims, 3 Drawing Sheets

(51) Int. Cl.
  *H03H 17/02* (2006.01)
  *H03H 17/04* (2006.01)
  *H03H 17/06* (2006.01)
(52) U.S. Cl.
  CPC ........ *H03H 17/0671* (2013.01); *H03M 3/462* (2013.01); *H04J 3/025* (2013.01)
(58) Field of Classification Search
  USPC .................................................. 708/313, 316
  See application file for complete search history.

(56) References Cited

U.S. PATENT DOCUMENTS

| | | | | |
|---|---|---|---|---|
| 5,345,236 A * | 9/1994 | Sramek, Jr. | ........... | H03M 3/474 341/143 |
| 5,561,425 A * | 10/1996 | Therssen | ............... | H03M 3/474 341/141 |
| 5,590,065 A * | 12/1996 | Lin | .................... | H03H 17/0286 708/313 |
| 5,805,479 A * | 9/1998 | Tang | ....................... | H03H 17/04 708/316 |
| 6,788,233 B1 * | 9/2004 | Quiquempoix | ...... | H03H 17/025 341/143 |
| 7,613,760 B1 * | 11/2009 | Esposito | ............ | H03H 17/0223 708/313 |
| 7,823,092 B1 * | 10/2010 | Perry | .................. | G06F 17/5045 716/101 |

OTHER PUBLICATIONS

International Search Report dated Sep. 8, 2015 in PCT/JP2015/070238 filed Jul. 15, 2015.

* cited by examiner

DIGITAL FILTER

TECHNICAL FIELD

The present invention relates to a digital filter and specifically to a digital filter capable of processing data on a plurality of input channels.

BACKGROUND ART

Among high-precision AD converters, a ΔΣ AD converter is currently preferred as an AD converter for industrial applications. In a case of AD conversion of sensor signals, for example, the AD converter may be required to perform conversion of a plurality of inputs from the sensor. In an example application, a pressure sensor measures a differential pressure, a static pressure, and a temperature to adjust the properties of the sensor by performing an internal arithmetic operation. At this time, it is desirably required that the respective sensor outputs be obtained simultaneously. Accordingly, a plurality of ΔΣ AD converters each constituted by a ΔΣ modulator 100 and a digital filter 101 are provided in the prior art, as illustrated in FIG. 8, to process the plurality of sensor outputs. The configuration illustrated in FIG. 8 is typically formed on a single silicon chip.

The digital filter 101 (LPF: Low Pass Filter) used in the ΔΣ AD converter is also known by the name of decimation filter. As the decimation filter, a SINC filter having a simple internal configuration is preferably used. The SINC filter can be expressed by the transfer function $(1-z^{-N})/(1-z^{-1})$. By increasing the order of the ΔΣ modulator used in the ΔΣ AD converter, an increased effect of noise shaping can be achieved. It is well known that the order of the decimation filter (SINC filter) in the subsequent stage needs to be made higher than the order of the ΔΣ modulator.

Now, an AD converter using a second-order ΔΣ modulator, for example, is considered. As the SINC filter, a third-order filter is necessary, as illustrated in FIG. 9. The SINC filter is expressed by the transfer function $\{(1-z^{-N})/(1-z^{-1})\}^3$. Here, a technique is well known in which an integration calculation unit that represents the denominator of the transfer function is separated from a difference calculation unit that represents the numerator of the transfer function, and the difference calculation unit is placed after down-sampling at a frequency 1/N. In the example illustrated in FIG. 9, the SINC filter is configured such that integration calculation units 200 in three stages that are cascade-connected and difference calculation units 201 in three stages that are cascade-connected are connected via a frequency conversion unit 202. The frequency conversion unit 202 is formed of a flip-flop 203 illustrated in FIG. 10. The integration calculation units 200 operate at a sampling frequency $f_s$, and the difference calculation units 201 and the frequency conversion unit 202 operate at a sampling frequency $f_D=f_s/N$.

In the configuration illustrated in FIG. 9, both the integration calculation units and the difference calculation units are constituted by digital circuits, and therefore, their signal lines have a bit width of a plurality of bits. The bit width needs to be selected so as not to cause internal saturation. The bit width depends on the frequency ratio N for down-sampling and needs to be equal to $K \times \log2(N)+1$[bit] (see literature "J. C. Candy and G. C. Temes, "Oversampling Delta-Sigma Data Converters", IEEE Press, pp. 1-29, 1991"). Here, K is the number of stages of the filter. If the SINC filter is a third-order filter, as illustrated in FIG. 9, K=3 is satisfied. In a case where 16-bit precision is required when N=256, for example, 25 bits are necessary. Therefore, a register that corresponds to the bit width is necessary.

Accordingly, a register that corresponds to the bit width of data is necessary for a digital filter. The circuit scale of an addition circuit and a subtraction circuit used to add and subtract data within the register becomes larger as the bit width increases. In industrial applications, high bit resolution and high precision are much desired, and therefore, the output from a digital filter often ranges from 16 bits to 24 bits. Accordingly, the circuit scale increases. Further, if a plurality of AD converters are provided for a plurality of inputs, as illustrated in FIG. 8, the ΔΣ modulator 100 and the digital filter 101 need to be provided for each input, resulting in a significant increase in the circuit scale.

Regarding a multi-input ΔΣ modulator that processes a plurality of inputs, a configuration with which the circuit scale and cost are reduced is proposed in Japanese Patent No. 4171222; however, a method for reducing the circuit scale and cost of a multi-input digital filter is not known.

SUMMARY OF INVENTION

Technical Problem

A technique in which a plurality of AD converters are provided for a plurality of inputs is not desirable in terms of the cost and the substrate size. In the case where a plurality of AD converters are formed on a single silicon chip, the chip area increases, which leads to an increase in the unit price of the chip, and therefore, a reduction of the circuit scale and cost is desired. As described above, for a multi-input ΔΣ modulator, a configuration with which the circuit scale and cost are reduced is proposed in Japanese Patent No. 4171222; however, a method for reducing the circuit scale and cost of a multi-input digital filter is not known. Note that the issue of reducing the circuit scale and cost arises not only in an AD converter but also in any field in which a multi-input digital filter is used.

The present invention has been made to address the above-described issue, and an object thereof is to reduce the circuit scale and cost of a digital filter capable of processing data on a plurality of input channels.

Solution to Problem

A digital filter according to the present invention includes: a plurality of integration calculation units that are cascade-connected, are fed time-division-multiplexed data, the time-division-multiplexed data being formed of pieces of data on M channels (M is an integer equal to or larger than two) that are time-division multiplexed, the pieces of data on the respective channels being updated at a rate equal to a sampling frequency $f_s$, operate in accordance with a clock having a frequency $f_s \times M$, and integrate the time-division-multiplexed data for every M samples; a frequency conversion unit that operates in accordance with a clock having a frequency $f_D \times M$ for performing sampling on each of the channels at a frequency equal to a sampling frequency $f_D=f_s/N$ (N is an integer equal to or larger than two), decimates data at the sampling frequency $f_s$ input from an integration calculation unit in a last stage among the integration calculation units at the sampling frequency $f_D$, and delays data obtained as a result of decimation by (M−1) samples; and a plurality of difference calculation units that operate in accordance with the clock having the frequency $f_D \times M$ for performing sampling on each of the channels at the frequency equal to the sampling frequency $f_D$, are cascade-connected to an output of the frequency conversion unit, and each subtract, from data input thereto, data M samples before.

A digital filter according to the present invention includes: a multiplexer that is fed pieces of data on M channels (M is an integer equal to or larger than two) at a sampling frequency $f_s$, and generates time-division-multiplexed data formed of the pieces of data on the M channels that are time-division multiplexed, the pieces of data on the respective channels being updated at a rate equal to the sampling frequency $f_s$; a plurality of integration calculation units that are cascade-connected to an output of the multiplexer, operate in accordance with a clock having a frequency $f_s \times M$, and integrate the time-division-multiplexed data for every M samples; a frequency conversion unit that operates in accordance with a clock having a frequency $f_D \times M$ for performing sampling on each of the channels at a frequency equal to a sampling frequency $f_D = f_s/N$ (N is an integer equal to or larger than two), decimates data at the sampling frequency $f_s$ input from an integration calculation unit in a last stage among the integration calculation units at the sampling frequency $f_D$, and delays data obtained as a result of decimation by (M−1) samples; and a plurality of difference calculation units that operate in accordance with the clock having the frequency $f_D \times M$ for performing sampling on each of the channels at the frequency equal to the sampling frequency $f_D$, are cascade-connected to an output of the frequency conversion unit, and each subtract, from data input thereto, data M samples before.

Advantageous Effects of Invention

According to the present invention, in response to input of time-division-multiplexed data formed of pieces of data on M channels that are time-division multiplexed, each of the integration calculation units integrates data input thereto for every M samples, the frequency conversion unit decimates, at the sampling frequency $f_D$, data at the sampling frequency $f_s$ and delays data obtained as a result of decimation by (M−1) samples, and each of the difference calculation units subtracts, from data input thereto, data M samples before. Accordingly, unlike the prior art, it is possible to process inputs from M channels without a need to provide M digital filters, and to reduce the circuit scale and cost of the digital filter.

Further, according to the present invention, the multiplexer can be provided at the input of the digital filter to respond to a case where pieces of data on M channels are simultaneously input.

DESCRIPTION OF EMBODIMENTS

[First Embodiment]

Figure 1:
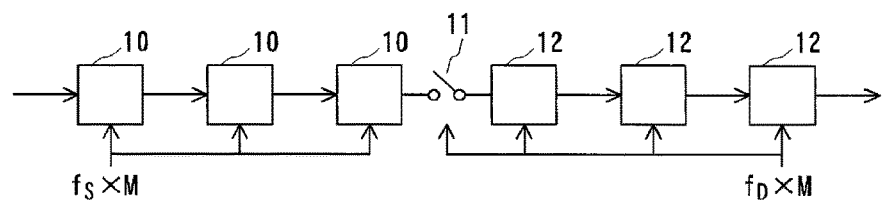
FIG. 1 is a block diagram illustrating a configuration of a digital filter according to a first embodiment of the present invention.

Hereinafter, embodiments of the present invention are described with reference to the drawings. FIG. 1 is a block diagram illustrating a configuration of a digital filter according to a first embodiment of the present invention. The digital filter according to this embodiment includes a plurality of integration calculation units 10, a frequency conversion unit 11, and a plurality of difference calculation units 12. The plurality of integration calculation units 10 are cascade-connected, are fed time-division-multiplexed data, the time-division-multiplexed data being formed of pieces of data on M channels (M is an integer equal to or larger than two) that are time-division multiplexed, the pieces of data on the respective channels being updated at a rate equal to a sampling frequency $f_s$, operate in accordance with a clock having a frequency $f_s \times M$, and integrate the time-division-multiplexed data for every M samples. The frequency conversion unit 11 operates in accordance with a clock having a frequency $f_D \times M$ for performing sampling on each of the channels at a frequency equal to a sampling frequency $f_D = f_s/N$ (N is an integer equal to or larger than two), decimates data at the sampling frequency $f_s$ input from the integration calculation unit 10 in the last stage at the sampling frequency $f_D$, and delays data obtained as a result of decimation by (M−1) samples. The plurality of difference calculation units 12 operate in accordance with the clock having the frequency $f_D \times M$ for performing sampling on each of the channels at the frequency equal to the sampling frequency $f_D$, are cascade-connected to the output of the frequency conversion unit 11, and each subtract, from data input thereto, data M samples before.

Figure 2:
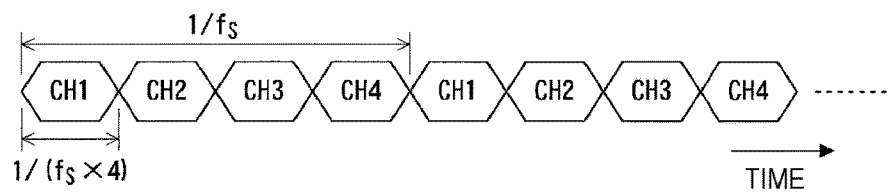
FIG. 2 is a diagram for describing time-division-multiplexed data input to the digital filter according to the first embodiment of the present invention.

The digital filter according to this embodiment is fed data formed of pieces of data on M channels that are time-division multiplexed, as illustrated in FIG. 2. The example in FIG. 2 illustrates a case where pieces of data on four channels (M=4), namely, CH1, CH2, CH3, and CH4, are time-division multiplexed. The pieces of data on the respective channels are updated at a rate equal to the sampling frequency $f_s$.

Figure 3:
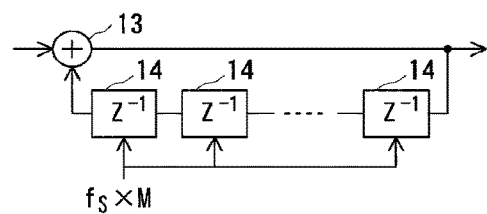
FIG. 3 is a block diagram illustrating a configuration of an integration calculation unit of the digital filter according to the first embodiment of the present invention.

FIG. 3 is a block diagram illustrating a configuration of a representative one of the integration calculation units 10. Each of the integration calculation units 10 is constituted by an addition unit 13 and M cascade-connected delay units 14. The addition unit 13 adds data at the sampling frequency $f_s$ input to the integration calculation unit 10 to an integration result one sample before. The M cascade-connected delay units 14 each delay an integration result output from the addition unit 13 by the cycle of the clock having the frequency $f_s \times M$ to feed data obtained in the last stage to the addition unit 13. Accordingly, each of the integration calculation units 10 integrates data input thereto for every M clocks (for every M samples). In a case where the digital filter of this embodiment is used as a decimation filter in the stage subsequent to a ΔΣ modulator, for example, the number of stages K of the integration calculation unit 10 (that is, the order of the digital filter, where K is an integer equal to or larger than two and is equal to three in this embodiment) needs to be made higher than the order of the ΔΣ modulator.

The frequency conversion unit 11 operates in accordance with the clock having the frequency $f_D \times M$ for performing sampling on each of the channels at the frequency equal to the sampling frequency $f_D = f_s/N$ (where N, which is the frequency ratio for down-sampling, is an integer equal to or larger than two), decimates data at the sampling frequency $f_s$ input from the integration calculation unit 10 in the last stage at the sampling frequency $f_D$, and delays data at the sampling frequency $f_D$ obtained as a result of decimation by (M−1) samples.

Figure 4:
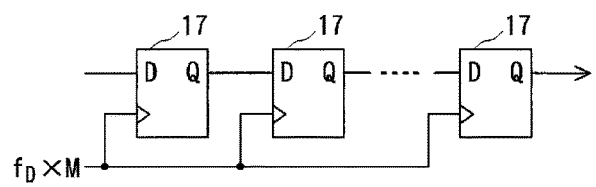
FIG. 4 is a block diagram illustrating a configuration of a frequency conversion unit of the digital filter according to the first embodiment of the present invention.

FIG. 4 is a block diagram illustrating a configuration of the frequency conversion unit 11. The frequency conversion unit 11 is constituted by M cascade-connected flip-flops 17 that each retain and output input data for each clock having the frequency $f_D \times M$.

The flip-flop 17 in the first stage retains and outputs, for each clock having the frequency $f_D \times M$, data at the sampling frequency $f_s$ input from the integration calculation unit 10. The flip-flop 17 in the first stage operates in accordance with the clock having the frequency $f_D \times M$. Regarding the pieces of data on the respective channel, the pieces of data, which occur at the sampling frequency $f_s$, are decimated at the sampling frequency $f_D$.

Figure 5:
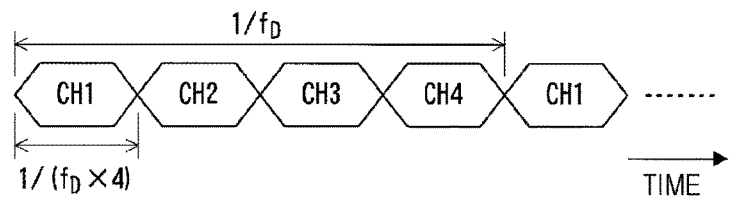
FIG. 5 is a diagram for describing time-division-multiplexed data output from the frequency conversion unit of the digital filter according to the first embodiment of the present invention.

Each of the flip-flops 17 other than the flip-flop 17 in the first stage retains and outputs, for each clock having the frequency $f_D \times M$, data at the sampling frequency $f_D \times M$ input from the flip-flop 17 in the preceding stage to thereby delay the input data by one sample (by the cycle of the clock having the frequency $f_D \times M$). Time-division-multiplexed data output from the frequency conversion unit 11 is as illustrated in FIG. 5.

Figure 6:
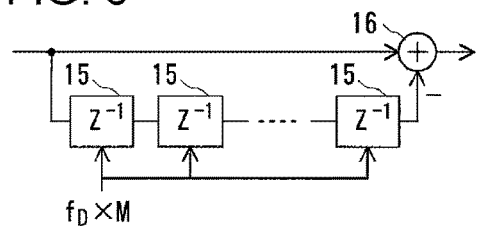
FIG. 6 is a block diagram illustrating a configuration of a difference calculation unit of the digital filter according to the first embodiment of the present invention.

FIG. 6 is a block diagram illustrating a configuration of a representative one of the difference calculation units 12. Each of the difference calculation units 12 is constituted by M cascade-connected delay units 15 and a subtraction unit 16. The M cascade-connected delay units 15 each delay data at the sampling frequency $f_D$ input to the difference calculation unit 12 by the cycle of the clock having the frequency $f_D \times M$. The subtraction unit 16 subtracts output data from the delay unit 15 in the last stage from the data input to the difference calculation unit 12. Accordingly, each of the difference calculation units 12 subtracts, from data at the sampling frequency $f_D$ input to the difference calculation unit 12, data one sample before. The number of stages of the difference calculation unit 12 is K, which is equal to the number of stages of the integration calculation unit 10.

As described above, in this embodiment, in order to process input time-division-multiplexed data formed of pieces of data on M channels that are time-division multiplexed, the M delay units 14 and the M delay units 15, which correspond to the number of channels M, are respectively provided in each of the integration calculation units 10 and in each of the difference calculation units 12 that constitute the digital filter. Further, in contrast to the frequency conversion unit 202 according to the prior art, which is implemented by using a single flip-flop, the frequency conversion unit 11 is constituted by the M flip-flops 17, which correspond to the number of channels M. Accordingly, unlike the prior art, it is possible to process inputs from M channels without a need to provide M digital filters, and to reduce the circuit scale and cost of the digital filter.

Figure 8:
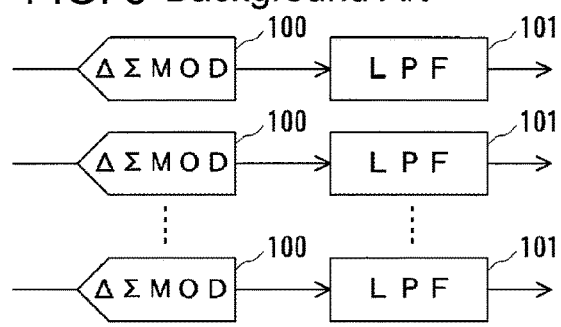
FIG. 8 is a block diagram illustrating a configuration of a ΔΣ AD converter that processes multiple inputs according to the prior art.
Figure 9:
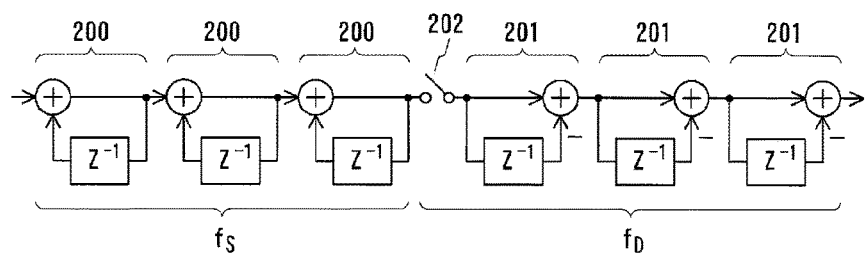
FIG. 9 is a block diagram illustrating a configuration of a SINC filter according to the prior art.
Figure 10:
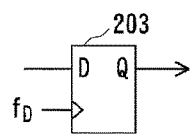
FIG. 10 is a block diagram illustrating a configuration of a frequency conversion unit of the SINC filter according to the prior art.

In the case where the plurality of digital filters 101 are provided as in the prior art illustrated in FIG. 8, a number of addition units corresponding to the number of input channels and a number of subtraction units corresponding to the number of input channels are necessary. In contrast, in this embodiment, the number of delay units 14 used, the number of delay units 15 used, and the number of flip-flops 17 used remain the same as in the prior art; however, the addition unit 13 and the subtraction unit 16 are shared among the input channels. Accordingly, the circuit scale can be significantly reduced.

Table 1 shows the circuit scale (combination result of FPGA (Field Programmable Gate Array)) according to the prior art and that according to this embodiment, for example. The example shown in Table 1 assumes the number of input channels to be four. That is, in the case of the prior art, four digital filters are provided. It is found that the circuit scale can be significantly reduced with this embodiment compared to the prior art.

TABLE 1

| | FPGA (Cyclone II) Combination Result | |
| --- | --- | --- |
| | Prior art | Embodiment |
| Combinational Circuit Scale | 5188 | 300 |
| Register Scale | 1092 | 291 |

Note that this embodiment is applicable not only to a decimation filter provided in the stage subsequent to the multi-input ΔΣ modulator proposed in Japanese Patent No. 4171222 but also to any digital filter to which time-division-multiplexed data is input.

[Second Embodiment]

Figure 7:
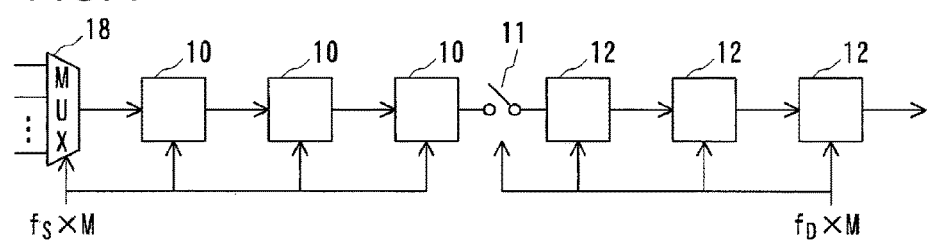
FIG. 7 is a block diagram illustrating a configuration of a digital filter according to a second embodiment of the present invention.

The first embodiment assumes that time-division-multiplexed data is input to the digital filter; however, time-division-multiplexed data may be generated within a digital filter. FIG. 7 is a block diagram illustrating a configuration of a digital filter according to a second embodiment of the present invention. In FIG. 7, components that are the same as in FIG. 1 are assigned the same reference numerals. The digital filter according to this embodiment is configured by adding a multiplexer 18 to the input of the digital filter according to the first embodiment illustrated in FIG. 1.

The multiplexer 18 is fed pieces of data on M channels at the sampling frequency $f_s$ and outputs the pieces of data on the M channels by sequentially selecting the channels one by one in synchronization with the clock having the frequency $f_s \times M$ to thereby generate time-division-multiplexed data formed of the pieces of data on the M channels that are time-division multiplexed. As described in the first embodiment, the pieces of data on the respective channels are updated at a rate equal to the sampling frequency $f_s$.

The remaining components are as described in the first embodiment.

Accordingly, time-division-multiplexed data can be input to the integration calculation units 10 of the digital filter in this embodiment, and therefore, an effect similar to that of the first embodiment can be achieved even if pieces of data on M channels are simultaneously input.

The first embodiment and the second embodiment do not respectively mention the bit width of signal lines from the input to the output of the digital filter illustrated in FIG. 1 and the bit width of signal lines from the input to the output of the digital filter illustrated in FIG. 7. The bit width of the signal lines ranges from 16 bits to 24 bits, for example.

INDUSTRIAL APPLICABILITY

The present invention is applicable to a digital filter.

REFERENCE SIGNS LIST

10 . . . integration calculation unit, 11 . . . frequency conversion unit, 12 . . . difference calculation unit, 13 . . . addition unit, 14, 15 . . . delay unit, 16 . . . subtraction unit, 17 . . . flip-flop, 18 . . . multiplexer.

The invention claimed is:

1. A digital filter, comprising:
a plurality of integration calculation circuits that are cascade-connected, are fed time-division-multiplexed data, the time-division-multiplexed data being formed of pieces of data on M channels (M being an integer equal to or larger than two) that are time-division multiplexed, the pieces of data on the respective channels being updated at a rate equal to a sampling frequency $f_s$, operate in accordance with a first clock having a frequency $f_s \times M$, and integrate the time-division-multiplexed data for every M samples;
a frequency conversion circuit that operates in accordance with a second clock having a frequency $f_D \times M$ for performing sampling on each of the channels at a frequency equal to a sampling frequency $f_D = f_s/N$ (N being an integer equal to or larger than two), decimates data at the sampling frequency $f_s$ input from an integration calculation circuit in a last stage among the integration calculation circuits at the sampling frequency $f_D$, and delays data obtained as a result of decimation by (M−1) samples; and
a plurality of difference calculation circuits that operate in accordance with the second clock having the frequency $f_D \times M$ for performing sampling on each of the channels at the frequency equal to the sampling frequency $f_D$, are cascade-connected to an output of the frequency conversion circuit, and each subtract, from data input thereto, data M samples before the input data.

2. The digital filter according to claim 1, wherein each of the integration calculation units includes
an adder that adds input time-division-multiplexed data to an integration result one sample before, and
M cascade-connected first delay circuits that each delay an integration result input from the adder by a cycle of the first clock having the frequency $f_s \times M$ to feed data obtained in a last stage thereof to the adder;
the frequency conversion circuit includes M cascade-connected flip-flops that retain and output, for each cycle of the second clock having the frequency $f_D \times M$, data input from the integration calculation circuit in the last stage among the integration calculation circuits; and
each of the difference calculation circuits includes M cascade-connected second delay circuits that each delay data input from the frequency conversion circuit by a cycle of the second clock having the frequency $f_D \times M$, and
a subtractor that subtracts output data from a second delay circuit in a last stage among the second delay circuits from the data input from the frequency conversion circuit.

3. A digital filter, comprising:
a multiplexer that is fed pieces of data on M channels (M being an integer equal to or larger than two) at a sampling frequency $f_s$, and generates time-division-multiplexed data formed of the pieces of data on the M channels that are time-division multiplexed, the pieces of data on the respective channels being updated at a rate equal to the sampling frequency $f_s$;
a plurality of integration calculation circuits that are cascade-connected to an output of the multiplexer, operate in accordance with a first clock having a frequency $f_s \times M$, and integrate the time-division-multiplexed data for every M samples;
a frequency conversion circuit that operates in accordance with a second clock having a frequency $f_D \times M$ for performing sampling on each of the channels at a frequency equal to a sampling frequency $f_D = f_s/N$ (N being an integer equal to or larger than two), decimates data at the sampling frequency $f_s$ input from an integration calculation circuit in a last stage among the integration calculation circuits at the sampling frequency $f_D$, and delays data obtained as a result of decimation by (M−1) samples; and
a plurality of difference calculation circuits that operate in accordance with the second clock having the frequency $f_D \times M$ for performing sampling on each of the channels at the frequency equal to the sampling frequency $f_D$, are cascade-connected to an output of the frequency conversion circuit, and each subtract, from data input thereto, data M samples before the input data.

4. The digital filter according to claim 3, wherein each of the integration calculation circuits includes
an adder that adds input time-division-multiplexed data to an integration result one sample before, and
M cascade-connected first delay circuits that each delay an integration result input from the adder by a cycle of the first clock having the frequency $f_s \times M$ to feed data obtained in a last stage thereof to the adder,
the frequency conversion circuit includes M cascade-connected flip-flops that retain and output, for each cycle of the second clock having the frequency $f_D \times M$, data input from the integration calculation circuit in the last stage among the integration calculation circuits, and
each of the difference calculation circuits includes
M cascade-connected second delay circuits that each delay data input from the frequency conversion circuit by a cycle of the second clock having the frequency $f_D \times M$, and
a subtractor that subtracts output data from a second delay circuit in a last stage among the second delay circuits from the data input from the frequency conversion circuit.

* * * * *